United States Patent

[11] 3,632,432

[72] Inventor Jiri Sandera
Manhattan Beach, Calif.

[21] Appl. No. 826,348
[22] Filed May 21, 1969
[45] Patented Jan. 4, 1972
[73] Assignee Continental Device Corporation
Hawthorne, Calif.

[54] GLASS-COATED SEMICONDUCTOR
7 Claims, 4 Drawing Figs.

[52] U.S. Cl. .......... 117/201, 106/47, 106/54
[51] Int. Cl. .......... H01b 1/04
[50] Field of Search .......... 117/201; 106/47, 54

[56] References Cited
UNITED STATES PATENTS
3,408,212 10/1968 Dumesnil .......... 117/201 X

*Primary Examiner*—William L. Jarvis
*Attorney*—Nilsson, Robbins, Wills & Berliner

ABSTRACT: Improved glass compositions for overcoating the surface of a silicon semiconductor device that has at least one PN junction, at least a portion of such junction extending to the surface. The glass compositions impart significantly improved electrical properties to the devices, particularly with respect to polarization effects.

INVENTOR
JIRI SANDERA

BY Nilsson + Robbins
ATTORNEYS

GLASS-COATED SEMICONDUCTOR

BACKGROUND OF THE INVENTION

1. Field of the Invention

The field of art to which the invention pertains includes the fields of barrier layer devices and glass compositions therefor.

2. Description of the Prior Art

Semiconductor diodes and transistors for use in various signal applications are made to exacting specifications to assure desired electrical characteristics and to provide precise performance. To retain those characteristics, it is necessary to protect the surfaces about the exposed junctions from conditions which would impair their characteristics or would otherwise damage or destroy the devices. Surface contaminants, moisture, harmful vapors, and changes in surface states are detrimental to the proper operation of semiconductor devices. Heretofore, it has been determined that when a thin, inherent silicon dioxide film is produced over an exposed PN-junction, or junctions, of a semiconductor device, that junction is passivated. Further protection from the action of junction-impairing contaminants is obtained by intimately bonding a thin impervious coating of glass to the silicon dioxide film. Semiconductor device with protected PN-junctions, and techniques for protecting them with silicon dioxide films and glass coatings bonded thereover, are disclosed in U.S. Pat. Nos. 3,247,428 to Perri and Riseman, 3,212,921 to Pliskin and Conrad, 3,303,399 to Hodgendorn and Merrin, and 3,323,956 to Gee.

The foregoing procedure does have drawbacks; I have found that conventionally available glass compositions having expansion coefficients suitable for bonding to a silicon dioxide surface often have a deleterious effect on certain electrical properties of the devices, particularly with regard to polarization effects. A polarization effect is the change, usually irreversible, induced by extended electrical bias under high temperature followed by cooling of the device while under the bias. In a typical test, polarization is induced by baking the diode at about 175° C. under −50 volt bias for 18 hours. After cooling under the bias, it is immediately obvious that the polarization effect has set in. Measurements of the backcurrent before and after polarization reveal large increases in backcurrent, often doubling or more.

SUMMARY OF THE INVENTION

In accordance with the present invention, deleterious polarization effects can be significantly reduced and in some cases entirely eliminated by incorporating in the glass compositions that overcoats the silicon semiconductor surface, an oxide of a metal selected from strontium and vanadium. Thus, strontium oxide, strontium peroxide, vanadium trioxide, and vanadium pentoxide each imparts improved polarization resistance to glass compositions in which they are incorporated.

In another embodiment, a new glass composition is provided which, in addition to the foregoing oxide, contains substantial proportions of boron oxide and zinc oxide, the molar concentrations of such boron oxide and zinc oxide each being at least several times the molar concentration of any other ingredient in the glass. Vanadium pentoxide is a particularly suitable additional additive to this boron oxide-zinc oxide glass. Germanium dioxide can also be added, to match the coefficient of expansion of the material on which the glass is coated without detracting from the beneficial properties of the glass. This new glass composition can be bonded directly to the silicon semiconductor surface or silicon dioxide intermediate layer to aid in passivation of such surface without giving rise to any significantly harmful polarization effect.

DESCRIPTION OF THE PREFERRED EMBODIMENTS

General Method of Applying Glass

Figure 1:
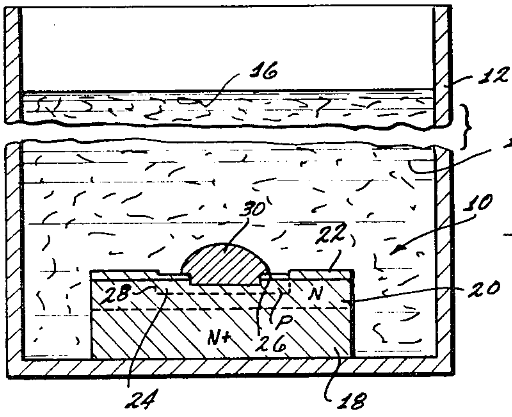
FIG. 1 is a cross-sectional elevational, somewhat diagrammatic view of a semiconductor device during the initial stages of the deposition of a glass coating thereover.

Referring to FIG. 1, there is illustrated a semiconductor diode device 10 located on the bottom of a centrifuge tube 12. The tube 12 contains an organic fluid 14 which carries a suspension of finely divided glass particles 16, preparatory to deposition of such particles 16 on the upper surface of the device 10. In preparing the semiconductor device 10, a silicon wafer 18 of N+ conductivity type is provided, of perhaps 0.005 to 0.010 ohm-centimeters resistance, and having a total thickness of the order of 6 mils. An epitaxial layer 20 is grown on the surface of the wafer 18, the layer 20 being of N-type and may be of the order of 1 to 10 ohm-centimeters resistivity. While a single-device wafer is illustrated, it is to be understood that there will customarily to be several thousands of devices produced simultaneously on a given crystal slice, to be subsequentially separated into individual devices.

In fabricating a silicon semiconductor diode the epitaxial layer 20 can be oxidized to form thereover a silicon dioxide film 22 of about 1 to 2 microns thickness, suitable for masking in an impurity diffusion process. The oxide film 22 is provided with an opening, or window, by means of photochemical masking and subsequent etching, as is well known in the art. After forming the operating in the oxide film 22, a P-type conductivity type determining impurity is diffused through the opening into the epitaxial layer 20 of the crystal to convert a region thereof 24 adjacent the opening to P-type. The foregoing process is illustrated in U.S. Pat. No. 2,802,760 to Derick and Frosch. Alternatively, an appropriate impurity can be fused or alloyed into the crystal through the opening in the silicon dioxide film 22 to form a region 24 of P-type material, after which the excess alloy can be removed, as by selective etching, to produce a substantially planar surface on the crystal 10. After formation of the P-type region 24, the opening in the silicon dioxide film 22 can be closed by the formation of a second silicon dioxide film 26, which may be formed by the same process as that used to form the first silicon dioxide film 22; or diffusion steps to produce the P-type region 24 may be conducted in an oxidizing atmosphere to simultaneously grow the silicon dioxide film 26. Both silicon dioxide films 22 and 26 may be indistinguishable except for thickness. A second opening is made in the regrown film 26 within the area of the original opening whereby to leave a portion of the new oxide film 26 extending over the PN-junction 28 from between the P-type region 24 and the adjacent portion of the epitaxial layer 20. The second opening may be formed by a photochemical etching process, such as was used to form the original window.

An electrical contact metal, such as silver, is next deposited within the area of the second opening in the second silicon dioxide film 28 by any suitable process, such as by electroless, electrolytic, evaporative plating, as is well known in the art. The deposited bump 30 is preferably of the order of ½-mil thickness or about 12 microns, as compared to about 1- to 2-microns thickness of the oxide films 22, 26.

Figure 2:
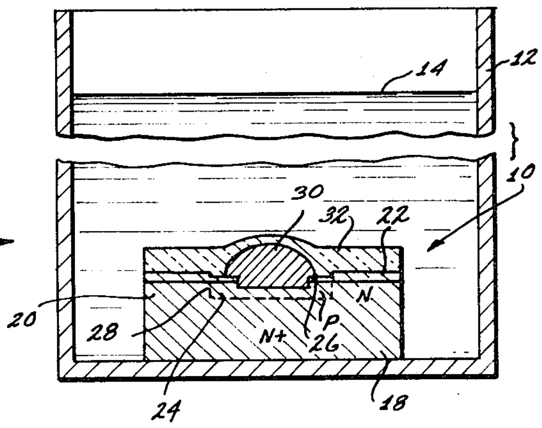
FIG. 2 is a view similar to FIG. 1 but in a later stage of such deposition, and illustrating a formed glass coating.

Next, and referring now also to FIG. 2, a glass film or layer 32 is applied to the silicon dioxide layers 22, 26 followed by a firing process which fuses the particles and forms a substantially void-free glass layer 32 that is intimately bonded to the underlying silicon dioxide layers 22, 26. Any of several well-known techniques, such as spraying or silk-screening a thin coating of finely divided glass particles, can be utilized to apply the glass. However, glass layers, including glass compositions of the present invention and having thickness in the range of 8 to 13 microns are adherent to oxidized silicon surfaces, and well-known centrifuging or sedimenting procedures for their deposition can be readily employed. Such a procedure is illustrated in the drawings. With reference again to FIG. 1, a semiconductor diode device 10 is centrifuged with its silicon dioxide layers 22, 26 thereon, but minus the glass layer 32, in an organic fluid having a dielectric constant in the range of about 3–21 and containing a suspension of finely divided glass particles. Such particles are thus deposited as a glass layer 32 on the silicon dioxide layers 22, 26, as illustrated in FIG. 2.

Suspending media for the glass particles 16 may include organic fluids, such as benzene, hexane, petroleum ether, methyl acetate, ethyl acetate, tertiary butyl alcohol mixed with a small amount of secondary butyl alcohol to maintain the former fluid at room temperature, isopropyl alcohol, acetone, methyl alcohol, dimethyl formamide and various mixtures of those fluids. A suspension of approximately 1 weight percent of fine glass particles in such fluids, say isopropyl alcohol, has been found generally satisfactory. Ultrasonic agitation for about 15–20 minutes, as is known in the art, has been found useful in helping to disperse the fine particles. Centrifuging at about 1,000 r.p.m. for about 3 minutes has proven generally satisfactory.

Figure 3:
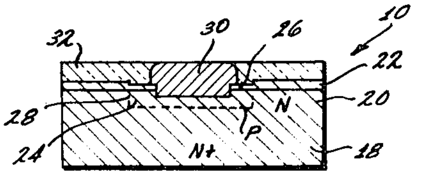
FIG. 3 is a cross-sectional elevational, diagrammatic view of the semiconductor device of FIG. 2 following lapping of the glass coating to expose electrical lead means thereon.

Thereafter, the structure is removed from the fluid 14 and then heated near the softening temperature of the glass particles for a time sufficient to fuse those particles to the silicon dioxide film 22, 26, thereby producing a thin, uniform void-free glass layer 32 over the upper surface of the device 10. Fusing is accomplished by loading the devices 10 into appropriate jigs therefore, inserting the jigs into a muffle furnace operating at about 500°–950° C. and fusing the glass for about 2–5 minutes. It has been found that satisfactory fusions are obtained utilizing a fusion temperature of about 750° C. for about 4 minutes. During the fusion step, the deposited silver bump 30 may also fuse and may alloy slightly into the P-type region 24 of the crystal 10. It will also form a rounded, button shape over the edge of the oxide film 26 and will produce a bump under the glass film 32 causing the film to be thinner thereat. An opening is next produced in the thin portion of the glass film 32 to expose a portion of the silver bump 30. This can be accomplished by photochemical etching processes, above, but satisfactory results have been obtained merely by lapping the glass film on appropriate abrasive paper, e.g., 600A grit "Jewelite" abrasive paper. This results in the construction shown in FIG. 3.

Figure 4:
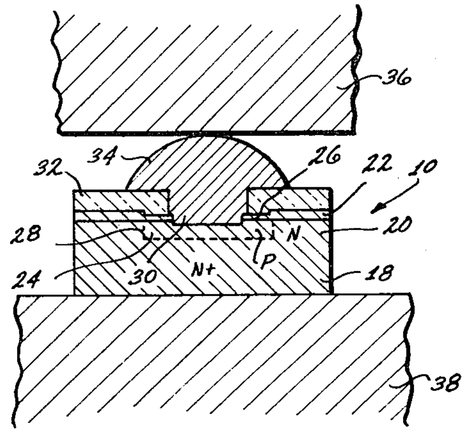
FIG. 4 is a cross-sectional elevational, diagrammatic view of the semiconductor device of FIGS. 1–3 completely constructed but without encapsulation media.

Referring to FIG. 4, an additional volume of silver is plated over and onto the silver bump 30 to substantially extend the volume of that silver bump to form an enlarged silver metal button contact 32. The device 10 may then be assembled into a circuit by attaching suitable leads 36 and 38 to the button 34, which is electrically connected to the P-type region 24, and to the back side of the crystal 10 in contact with the N+ region 18, in electrical connection with the N-type region 20.

The Glass Composition.

The glass composition utilized to form the glass layer 32 is obtained by milling an additive oxide of this invention together with any of the glass compositions that have been previously utilized in the passivation of silicon surfaces. Such glasses have generally been borosilicate glasses, containing boron oxide and silicon dioxide either as the only essential ingredients or in combination with varying amounts of a variety of other oxides, such as lead oxide, aluminum oxide, and barium dioxide. As an additive of this invention, one utilizes an oxide of a metal selected from strontium and vanadium. Thus, strontium oxide (SrO) strontium peroxide ($SrO_2$), vanadium trioxide ($V_2O_3$) or vanadium pentoxide ($V_2O_5$) can be utilized with standard glass formulations to impart improved electrical properties to semiconductor devices that utilize glass compositions in the aforedescribed manner.

As previously noted, when semiconductor diodes are maintained at high temperature under a reverse bias, a polarization effect generally sets in, which is evidenced by a relatively high reverse bias current. This reverse bias current is often double or more than the reverse bias current detected prior to such heat treatment of the diode. By incorporating an additive of this invention in an ordinary, commercially available glass composition, one can substantially decrease this polarization effect and, in some cases, eliminate the effect. Generally, any commercially available glass composition intended for bonding to the silicon or silicon dioxide surface of a semiconductor is improvable by incorporation therein of an additive of this invention. A variety of such glasses, particularly utilized with a silicon dioxide surface, is disclosed in U.S. Pat. No. 3,247,428 to Perri and Riseman. Compositions that have been proposed for directly coating the silicon surface of a semiconductor device, without an intervening silicon dioxide layer are disclosed in U.S. Pat. No. 3,303,399 to Hoogendoorn and Merrin; the disclosures of both of these patents are hereby incorporated by reference. By way of example, the following table sets forth analyses of commercially available glass compositions that have been benefited by the incorporation of one or more of the additives of this invention (expressed in mol percent):

TABLE I

| Glass | $SiO_2$ | $B_2O_3$ | PbO | $Al_2O_3$ | $BaO_2$ | Alkali metal oxide | $As_2O_3$ |
|---|---|---|---|---|---|---|---|
| A | 74.5 | 13.1 | 5.8 | 5.8 | | | 0.7 |
| B | 66.1 | 16.9 | 4.6 | 9.2 | 3.1 | | |
| C | 76.2 | 11.6 | | 4.5 | 1.3 | 6.4 | |
| D | 80.9 | 13.2 | | 1.2 | | 4.7 | |

The following examples will further illustrate this invention.

EXAMPLE I

To glass powder having the composition of glass A above, was added about 3 weight percent of vanadium pentoxide and the combination was milled in a SPEX 8000 Mixer/Mill for about 2 hours. The milled powder was suspended in isopropyl alcohol so as to form an approximately 1 weight percent suspension therein. Suspension was aided by ultrasonic vibration for about 15 minutes.

A semiconductor silicon diode, having a silicon dioxide surface covering its otherwise exposed PN-junction, was placed on the bottom of a centrifuge tube with its silicon dioxide surface facing the mouth of the tube. The glass suspension was poured into the centrifuge tube which was then operated at 1,000 r.p.m. for about 3 minutes. The diode was then placed in a jig therefore and the jig was placed into a muffle furnace set at about 750° C. and heated at that temperature for about 4 minutes to fuse the glass to the silicon dioxide. The fused surface was thereafter lapped and provided with a button contact and electrical leads, all as previously described with respect to the drawings.

Other silicon semiconductor diodes were similarly glassed but incorporated, as the additive to the glass A composition, 3 weight percent of strontium peroxide, in one case, and 3 weight percent vanadium trioxide, in another case. Additionally, a silicon semiconductor diode was glassed with the glass A composition but without the incorporation of an additive of this invention.

The diodes were tested by maintaining them at a temperature of about 175° C. under a negative bias of about 50 volts for 18 hours. The purpose of such test is to determine the extent of polarization of each diode. The following table II lists the results of these tests, where I*b* (pre) represents the backcurrent detected prior to polarization and I*b*(pol) represents the backcurrent detected subsequent to polarization.

TABLE II

| Additive | I*b*(pre)(na) | I*b*(pol)(na) | Change |
|---|---|---|---|
| None | 235 | 636 | 172% |
| $V_2O_5$ | 256 | 338 | 32% |

| | | | |
|---|---|---|---|
| $V_2O_3$ | 242 | 338 | 40% |
| $SrO_2$ | 287 | 321 | 11.8% |

Referring to table II, one can see very dramatic improvements when an oxide additive of this invention is utilized. Without any additive, polarization results in a 172 percent increase in backcurrent following the heat treatment. With the additives, back current increased to only 40 percent with vanadium trioxide, 32 percent with vanadium pentoxide, and only 11.8 percent with strontium peroxide.

EXAMPLE 2

Silicon semiconductor diodes were glassed following the procedure set forth in example 1 except that glass B, previously described, was utilized in place of glass A and the additives added were 3 weight percent of vanadium pentoxide, in one case, and 3 weight percent of strontium peroxide, in another case. Backcurrent measurements were made before and after heating, as in example 1, the results are listed in the following table III.

TABLE III

| Additive | Ib(pre) (na) | Ib(pol) (na) | Change |
|---|---|---|---|
| None | 227 | 515 | 127% |
| $V_2O_5$ | 231 | 349 | 51% |
| $SrO_2$ | 224 | 248 | 10.7% |

Referring to table III, we see that polarization in the unimproved glass caused an increase in backcurrent of 127 percent, whereas the glass containing vanadium pentoxide and the glass containing strontium peroxide record back current increases of only 51 and 10.7 percent, respectively.

The foregoing improvements were described with respect to commercially available glass compositions and the additives of this invention are generally useful in any glass composition utilized for the protection of silicon dioxide surfaces. However, in another embodiment of this invention, a glass composition is provided that is uniquely benefited by incorporation of an additive of this invention, and particularly by the incorporation of vanadium pentoxide. Such a glass contains boron oxide and zinc oxide in such substantial proportions that the molar concentration of each is at least several times the molars concentration of any other ingredient of the glass. In numerical terms, about 45 to about 55 mol percent of zinc oxide and about 30 to 50 mol percent of boron oxide are combined with about 0.1 to about 5 mol percent of an oxide additive as previously described, to yield a new composition of this invention. In addition, as an agent to prevent bubbling on the silicon surface (by preventing, it is thought, chemical reaction of the glass with the silica surface to which the glass is to be adhered), a small amount, from about 0.1 to about 10 mol percent, of germanium dioxide can be utilized in the composition without deleteriously effecting the good properties thereof. The following example will illustrate this embodiment.

EXAMPLE 3

A glass composition was prepared by milling, as in example 1, except that sufficient zinc oxide, boron oxide, vanadium pentoxide and germanium dioxide were combined to yield a glass having the following composition in mol percent:

Zinc oxide (ZnO) 55.5
Boron oxide ($B_2O_3$) 40.2
Vanadium pentoxide ($V_2O_5$) 0.8
Germanium dioxide ($GeO_2$) 3.5

Deposition of the glass on the silicon dioxide surface of a semiconductor device was generally the same as practiced in example 1 except that the glass was laid down in two layers under an inert atmosphere of nitrogen. The first layer was deposited and fused and further glass was deposited and fused again. The device was then lapped as in example 1. The purpose for this departure was simply because this particular type of glass does not adhere in the same manner as the glass utilized in examples 1 and 2.

The device was tested, as in examples 1 and 2, to determine the extent of back current increase as a result of polarization. The results are listed in the following table IV.

TABLE IV

| Glass | Ib (pre)(na) | Ib(pol)(na) | Change |
|---|---|---|---|
| A | 235 | 636 | 172% |
| B | 227 | 515 | 127% |
| New glass | 196 | 189 | −3.6% |

Referring to the table we see that while each of the commercially available glass compositions substantially increase back current upon polarization, to the extent of 172 percent for glass A and 127 percent for glass B, the new glass did not impart any harmful polarization effects at all; in fact, a decrease in backcurrent was actually recorded.

In each of the foregoing examples, the test results given are averages of test results obtained with at least 10 semiconductor diodes.

I claim:

1. In a semiconductor silicon member having at least one PN-junction therein, at least a portion of which extends to a surface of sad member, and a borosilicate glass coating over said surface and junction, the improvement whereby said glass coating includes from about 0.1 to about 5 mol percent of an oxide of a metal selected from strontium and vanadium.

2. The improvement of claim 1 wherein said metal is vanadium.

3. The improvement of claim 1 wherein said oxide is vanadium trioxide.

4. The improvement of claim 1 wherein said oxide is vanadium pentoxide.

5. The improvement of claim wherein said oxide is strontium peroxide.

6. In a semiconductor silicon member having at least one PN-junction therein, at least a portion of which extends to a surface of said member, and a glass coating over said surface and junction, the improvement whereby said glass coating includes from about 0.1 to about 5 mol percent of oxide of strontium.

7. In a semiconductor silicon member having at least one PN-junction therein, at least a portion of which extends to a surface of said member, and a glass coating over said surface and junction, the improvement whereby said glass coating consists essentially of boron oxide, zinc oxide, from about 0.1 to about 5 mol percent of vanadium pentoxide and from about 0 to about 10 mol percent of germanium dioxide, the molar concentration of said boron oxide and zinc oxide being at least several times the molar concentration of any other ingredient of said glass.

* * * * *